United States Patent
Tateyama et al.

[11] Patent Number: 6,110,282
[45] Date of Patent: *Aug. 29, 2000

[54] COATING APPARATUS FOR SEMICONDUCTOR PROCESS

[75] Inventors: Kiyohisa Tateyama, Kumamoto; Tetsu Kawasaki, Yamanashi-ken, both of Japan

[73] Assignee: Tokyo Electron Limited, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/917,510

[22] Filed: Aug. 26, 1997

[30] Foreign Application Priority Data

Aug. 30, 1996  [JP]  Japan ..................................... 8-249229

[51] Int. Cl.⁷ ....................................................... B05C 5/00
[52] U.S. Cl. .......................... 118/712; 118/324; 118/410
[58] Field of Search ..................................... 118/324, 673, 118/679, 680, 681, 712, 313, 410; 134/129, 131; 156/350, 356, 367, 378, 578; 198/624, 785; 226/170–174, 190, 194; 271/272, 276

[56] References Cited

U.S. PATENT DOCUMENTS

| | | | |
|---|---|---|---|
| 3,557,938 | 1/1971 | Christensen | 118/313 |
| 3,915,606 | 10/1975 | Straub et al. | 118/324 |
| 3,954,261 | 5/1976 | Greene et al. | 271/272 |
| 4,762,578 | 8/1988 | Burgin, Jr. et al. | 118/712 |
| 5,186,451 | 2/1993 | Hira | 271/276 |
| 5,232,501 | 8/1993 | Pender et al. | 118/324 |
| 5,529,081 | 6/1996 | Kappler | 134/131 |

FOREIGN PATENT DOCUMENTS

| | | |
|---|---|---|
| 0 451 841 | 10/1991 | European Pat. Off. . |
| 0 559 465 | 9/1993 | European Pat. Off. . |
| 0 603 776 | 6/1994 | European Pat. Off. . |
| 4-124812 | 4/1992 | Japan . |
| 5-55133 | 3/1993 | Japan . |
| 7-326554 | 12/1995 | Japan . |

*Primary Examiner*—Laura Edwards
*Attorney, Agent, or Firm*—Oblon, Spivak, McClelland, Maier & Neustadt, P.C.

[57] ABSTRACT

A coating apparatus for coating an LCD substrate with a developing liquid for a photo-resist has a conveyer mechanism for linearly conveying the substrate in a conveying direction. The conveyer mechanism has a plurality of lower conveyer rollers which are driving rollers, and a plurality of upper conveyer rollers which are driven rollers. A main support roller is arranged such that it replaces one of the lower conveyer rollers. A developing liquid supply nozzle is arranged above the main support roller for supplying a developing liquid onto the substrate when the substrate is passing over the main support roller. The supply nozzle has a supply port which is laterally long and narrow, so that the developing liquid is supplied onto the substrate from the supply nozzle as a band. This band extends over the entire width of a target region of the substrate, which is perpendicular to the conveying direction, and is supplied thereto all at once.

23 Claims, 6 Drawing Sheets

2

COATING APPARATUS FOR SEMICONDUCTOR PROCESS

BACKGROUND OF THE INVENTION

The present invention relates to a coating apparatus for a semiconductor process, and, in particular, to an apparatus for coating a target substrate of a thin plate, such as a semiconductor wafer or an LCD substrate, with a process liquid, such as a photo-resist liquid or a developing liquid. The semiconductor process includes various kinds of processes which are performed to manufacture a semiconductor device or a structure having, e.g., wiring layers and electrodes to be connected to a semiconductor device on a target substrate, such as a semiconductor wafer or an LCD substrate, by forming semiconductor layers, insulating layers, and conductive layers in predetermined patterns on the target substrate.

In a process of manufacturing a semiconductor device or an LCD, coating apparatuses are utilized in various steps. A representative one of them is a coating apparatus of a photo-resist or a developing liquid, employed in a coating and developing system of the photo-resist. Such a coating apparatus should swiftly apply a process liquid to a target object, such as a semiconductor wafer or an LCD substrate, in a short period of time and efficiently perform a process with a small amount of the process liquid, without giving a shock to the target object or forming bubbles.

In light of the demand, Jpn. Pat. Appln. KOKAI Publication No. 5-55133 discloses a coating technique, which employs a spin chuck for holding a semiconductor wafer and a liquid supply nozzle arranged above the spin chuck. The supply nozzle has a number of small holes formed in the bottom of a liquid container having a rectangular shape, such that a developing liquid comes oozing through the small holes and is supplied onto the wafer.

Jpn. Pat. Appln. KOKAI Publication No. 4-124817 discloses another coating technique, which employs a supply nozzle having a delivery port of a long and narrow band shape. A process liquid is supplied to the narrow delivery port from a liquid reservoir arranged in the nozzle, and is then delivered in a long and narrow band shape from the delivery port.

Jpn. Pat. Appln. KOKAI Publication No. 7-326554 discloses still another coating technique. In this technique, a small amount of a developing liquid is supplied from a developing liquid supply nozzle, to form a liquid film on the surface of a semiconductor wafer which remains stationary right under the supply nozzle. Then, an amount of the developing liquid necessary for a predetermined liquid film thickness is supplied while moving the supply nozzle and the wafer relative to each other, to form a liquid film having the predetermined thickness on the surface of the wafer.

Where a target object, such as a semiconductor wafer or an LCD substrate, and a process liquid supply nozzle are moved relative to each other, so as to form a liquid film of a predetermined thickness on the surface of the target substrate, the supply nozzle and the substrate have to keep a certain positional relationship while they are relatively moved. For this reason, moving members require a high accuracy in running movement in order to keep their positional relationship.

Additionally, semiconductor wafers and LCD substrates have become large in recent years, thereby bringing about a difficulty in maintaining their flatness. As a result, a work table for a target substrate to be processed, having a large surface area, needs not only to keep its flatness, but also to correct the flatness of the target substrate thereon.

However, it is difficult for such a large work table to be finished with a high degree of flatness and high design accuracy. Further, a mechanism for moving a work table causes the whole apparatus to be bulky, and brings about a difficulty in providing high accuracy in planar positioning and running movement.

BRIEF SUMMARY OF THE INVENTION

An object of the present invention, therefore, is to provide a coating apparatus for a semiconductor process, which can coat a target substrate with a process liquid in a uniform film thickness, even if the target substrate has a problem in its flatness, such as a warp.

According to a first aspect of the present invention, there is provided a coating apparatus for a semiconductor process, for coating a target region of a substrate with a process liquid, comprising:

a plurality of lower conveyer rollers for supporting the substrate substantially horizontal and linearly conveying the substrate in a conveying direction while being in contact with a bottom surface of the substrate;

a main support roller for supporting the substrate in cooperation with the lower conveyer rollers while being in contact with the bottom surface of the substrate, the main support roller having a rotational axis extending perpendicular to the conveying direction;

a supply nozzle arranged above the main support roller for supplying the process liquid onto the target region when the substrate is being conveyed by the lower conveyer rollers and is passing over the main support roller, the supply nozzle having a supply port for supplying the process liquid all at once substantially all over a width of the target region perpendicular to the conveying direction; and a positioning mechanism for positioning the substrate relative to the supply nozzle in a direction perpendicular to the conveying direction when the substrate is passing over the main support roller and is being supplied with the process liquid from the supply nozzle.

According to a second aspect of the present invention, there is provided a coating apparatus for a semiconductor process, for coating a target region having a rectangular shape of a substrate having a rectangular shape with a process liquid, comprising:

a plurality of lower conveyer rollers for supporting the substrate substantially horizontal and linearly conveying the substrate in a conveying direction while being in contact with a bottom surface of the substrate, the conveying direction being set parallel to opposite sides of the substrate;

an upper conveyer roller having a rotational axis parallel to those of the lower conveyer rollers, the substrate being conveyed while being sandwiched between the lower conveyer rollers and the upper conveyer roller;

a main support roller for supporting the substrate in cooperation with the lower conveyer rollers while being in contact with the bottom surface of the substrate, the main support roller having a rotational axis extending perpendicular to the conveying direction, the main support roller having a plurality of suction holes on its circumferential surface so as to attract and hold the substrate by means of vacuum through the suction holes;

a supply nozzle arranged above the main support roller for supplying the process liquid onto the target region when the substrate is being conveyed by the lower conveyer rollers and is passing over the main support roller, the supply nozzle having a supply port for supplying the process liquid all at once substantially all over a width of the target region perpendicular to the conveying direction; and a positioning mechanism for positioning the substrate relative to the supply nozzle in a direction perpendicular to the conveying direction when the substrate is passing over the main support roller and is being supplied with the process liquid from the supply nozzle, the positioning mechanism comprising a pair of guide surfaces arranged to be brought into contact with opposite edges respectively belonging to the opposite sides of the substrate, the pair of guide surfaces being defined by side surfaces of a pair of conical portions arranged on at least one of the lower conveyer rollers, upper conveyer roller, and the main support roller so as to decrease their diameters toward each other.

With an increase in the size of a target subject, such as a semiconductor wafer or an LCD substrate, the substrate is warped more easily. Where such a warped substrate is mounted on a work table, contacting points between the substrate and the work table, which are far from a nozzle for supplying a process liquid, can have a great effect on a distance between the supply nozzle and the substrate. For this reason, it is difficult to maintain a constant distance between the supply nozzle and the substrate, only by mounting the substrate on the work table.

In contrast, according to the present invention, since contact with a substrate is made only by rollers, variations in a distance between the supply nozzle and the substrate are lowered, even if the substrate is warped. As a result, it is possible to form a uniform film thickness on the warped substrate. Further, since the relative positions of the supply nozzle and the main support roller, which corresponds to a work table, are maintained in a conveying direction of the substrate, there is no need to consider accuracy of running movement of a work table, which is required in a case where the work table is moved relative to a supply nozzle.

Further, where the main support roller is formed of a suction roller having a plurality of suction holes, the bottom surface of the substrate is attracted and held by the surface of the main support roller such that the horizontal flatness of the substrate is corrected in its width direction while the substrate is conveyed. As a result of correcting the horizontal flatness of the substrate in the width direction, a thin film having a uniform film thickness is formed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

DETAILED DESCRIPTION OF THE INVENTION

Figure 1:
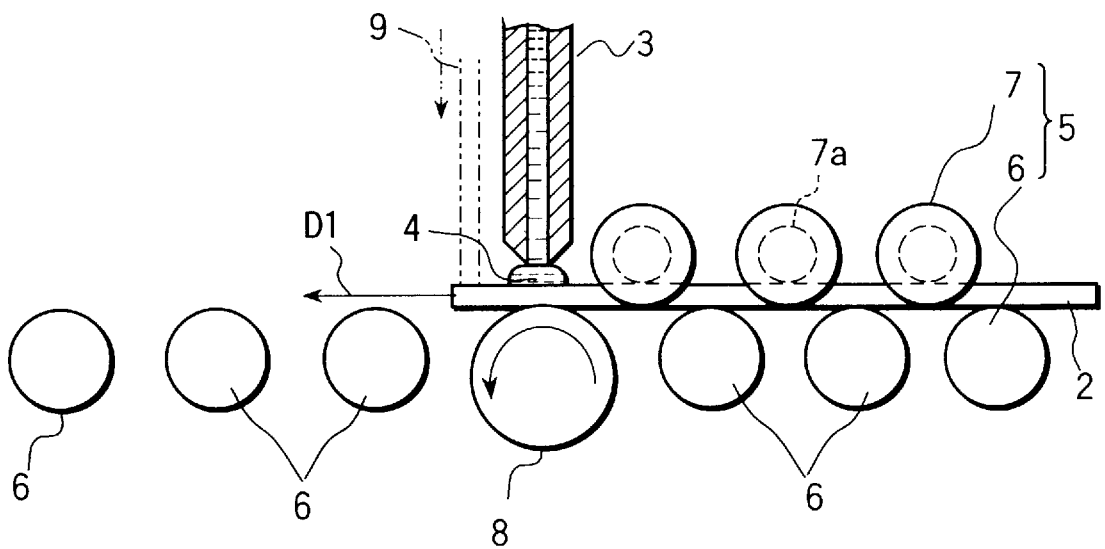
FIG. 1 is a partially cross-sectional side view schematically showing a coating apparatus according to an embodiment of the present invention.
Figure 3:
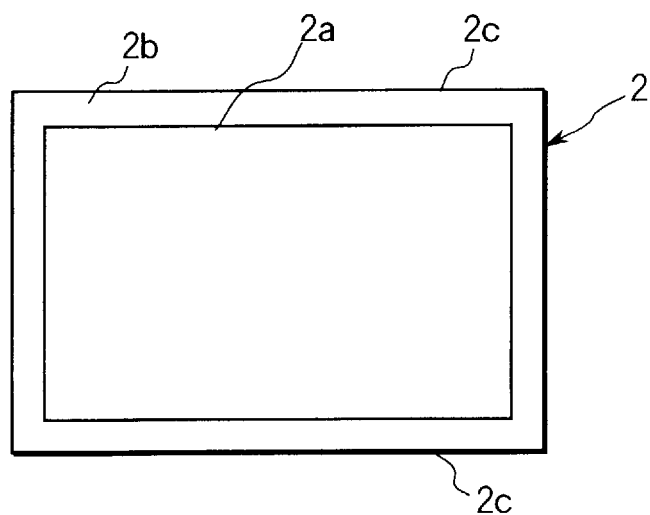
FIG. 3 is a plan view showing an LCD substrate to be processed in the coating apparatus shown in FIG. 1.

FIG. 1 is a partially cross-sectional side view schematically showing a coating apparatus 1 according to an embodiment of the present invention. The coating apparatus 1 is constituted to coat an LCD substrate having a rectangular shape as shown in FIG. 3 with a developing liquid for developing a photo-resist. The substrate 2 has a target region 2a, which requires a coat of the developing liquid, and a marginal region 2b surrounding the target region 2a. The marginal region 2b has a uniform width so that the contours of the substrate 2 and the target region 2a are arranged concentric.

As shown in FIG. 1, the coating apparatus 1 has a conveyer mechanism 5 for linearly conveying the substrate 2 in a direction D1. The conveying direction D1 is arranged to be parallel to both sides 2c and 2c of the substrate 2, which face each other. A developing liquid supply nozzle 3 is arranged for supplying a developing liquid 4 onto the target region 2a while the substrate 2 is conveyed by the conveyer mechanism 5. The supply nozzle 3 has a supply port which is laterally long and narrow, so that the developing liquid 4 is discharged from the supply nozzle 3 as a band. This band extends substantially all over the entire width of the target region 2a, which is perpendicular to the conveying direction D1, and is supplied thereto all at once. Since the developing liquid 4 is delivered from the supply nozzle 3 while the substrate 2 is being conveyed, as the developing liquid band having substantially the same width as that of the target region 2a, the target region 2a is ultimately entirely supplied with the developing liquid 4.

The conveyer mechanism 5 has a plurality of lower conveyer rollers 6 which are driving rollers, and a plurality of upper conveyer rollers 7 which are driven rollers, wherein each of the rollers 6 and 7 have a rotational axis perpendicular to the conveying direction D1. The lower conveyer rollers 6 are arranged on both the upstream and downstream sides of the supply nozzle 3 to be brought into contact with the bottom surface of the substrate 2 so as to support the substrate substantially horizontal. The upper conveyer rollers 7 are arranged only on the upstream side of the supply nozzle 3 so as to generally face the lower conveyer rollers 6. On the upstream side of the supply nozzle 3, the substrate 2 is conveyed while being sandwiched between the lower and upper conveyer rollers 6 and 7 in a manner described later.

A main support roller 8 is arranged right under the supply nozzle 3 such that the roller 8 replaces one of the lower conveyer rollers 6. The main support roller 8 has a rotational axis perpendicular to the conveying direction D1 and functions as a driving roller. The main roller 8 is brought into contact with the bottom surface of the substrate 2 to support the substrate substantially horizontal in cooperation with the lower conveyer rollers 6. In other words, the developing liquid 4 is supplied, as a band extending substantially all over the entire width of the target region 2a, from the supply nozzle 3 onto the substrate 2, when the substrate is passing over the main support roller 8, while being conveyed by the lower conveyer roller 6.

Figure 2:
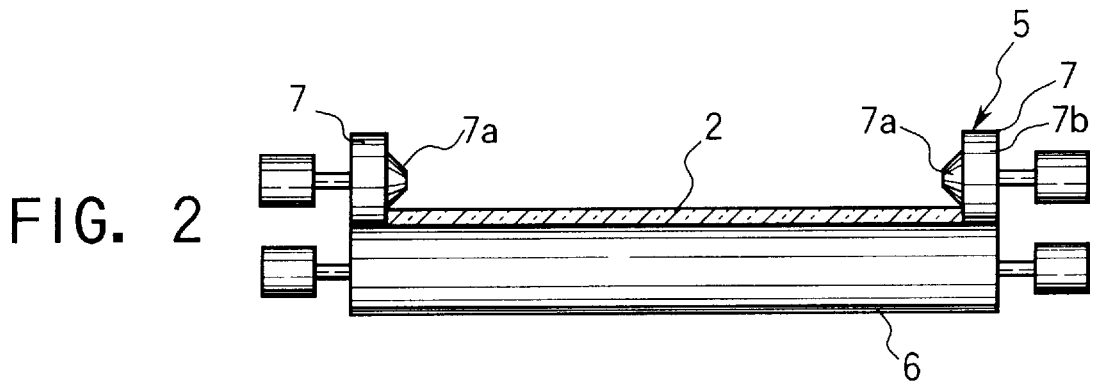
FIG. 2 is a partially cross-sectional front view showing a conveyer mechanism employed in the coating apparatus shown in FIG. 1.

As shown in FIG. 2, each of the lower conveyer rollers 6 extends all over the entire width of the substrate 2, while each of the upper conveyer rollers 7 is formed of a pair of roller members (7 and 7) arranged coaxial and symmetric only at positions near both the sides 2c and 2c of the substrate 2. The pair of roller members (7 and 7) in each of the upper conveyer rollers 7 have conical portions 7a which project by a length corresponding to the marginal region 2b of the substrate 2 and are coaxially arranged such that their diameters decrease toward each other. The substrate is pressed against the lower conveyer rollers 6 by the conical portions 7a, so that the substrate is sandwiched between the lower conveyer rollers 6 and the upper conveyer rollers 7 while being conveyed.

The side surfaces of the pair of conical portions 7a and 7a function as guide surfaces to be brought into contact with upper edges of both the sides 2c and 2c of the substrate 2. In other words, the side surfaces of the pair of conical portions 7a and 7a constitute a positioning mechanism for positioning the substrate relative to the supply nozzle 3 in a direction perpendicular to the conveying direction D1.

The pair of roller members (7 and 7) in each of the upper conveyer rollers 7 have large-diameter portions 7b arranged to project beyond the sides of the substrate 2. The axes of the upper conveyer rollers 7 are offset relative to the axes of the lower conveyer rollers 6 in the conveying direction D1, so that the large-diameter portions 7b of the upper conveyer rollers 7 and the lower conveyer rollers 6 do not interfere with each other.

When the substrate 2 is processed in the coating apparatus 1, the substrate 2 is fed into a space between the upper conveyer rollers 7 and lower conveyer rollers 6, as shown in FIG. 1. Note that, when the process is started, the substrate 2 may be pressed from above by a pressing rod 9, at a slightly downstream position relative to the main support roller 8, as shown with two-dot chain lines in FIG. 1. By doing so, even if the substrate 2 is warped, the warp is corrected so as to cause at least the front edge of the substrate to be essentially horizontal.

Then, the lower conveyer rollers 6 and the main support roller 8 are rotated at the same and constant circumferential speed so as to move the substrate 2 in the conveying direction D1, after the pressing rod 9 is detached if it is used.

When the substrate is passing over the main support roller 8, the developing liquid 4 is supplied essentially all over the entire width of the target region 2a from the supply nozzle 3. As a result, even if the substrate 2 is warped, the substrate 2 is coated with the developing liquid 4 having a film thickness more uniform than that obtained in a case where the substrate 2 is mounted on a work table and is coated with the liquid 4.

Where the warped substrate 2 is mounted on a work table which is moved for coating, a uniform film thickness is hard to obtain unless the work table has a predetermined flatness, and surface alignment and running movement of the table are accurate. Further, in this case, the warped portions of the substrate 2 interfere with the work table and exert influences on the entirety of the substrate 2, so that such a portion of the substrate 2 that is passing through right under the supply nozzle 3 is always influenced by the warped portions. In contrast, according to the coating apparatus 1 shown in FIG. 1, the substrate 2 is brought into line- or point-contact with each of the rollers 6 to 8, so that the warped portions of the substrate 2 can exert a lesser influence on that portion of the substrate 2 which is passing through right under the supply nozzle 3. Further, since the positional relationship between the supply nozzle 3 and the main support roller 8 is constant, a uniform film thickness can be formed. Furthermore, since both the sides 2c and 2c of the substrate 2 are sandwiched between the upper conveyer rollers 7 and the lower conveyer rollers 6, the substrate 2 is forced to be horizontal or flat, and the warped portions of the substrate are prevented from exerting an influence when the substrate 2 is fed into a space between the supply nozzle 3 and the main support roller 8.

Figure 4:
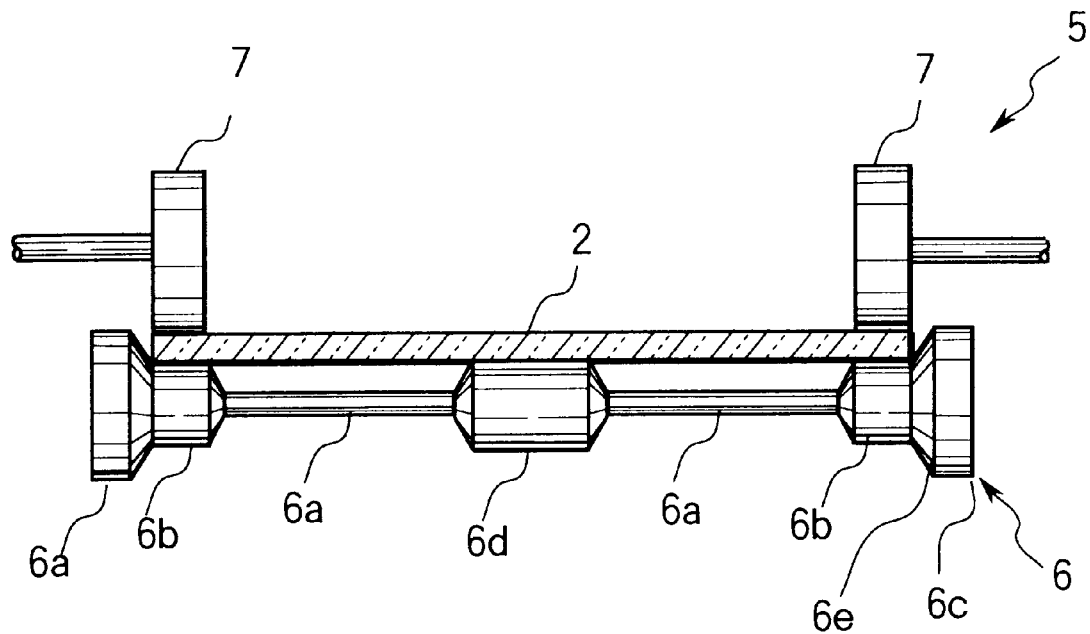
FIG. 4 is a partially cross-sectional front view showing a modification of the conveyer mechanism.

Although the back side of the substrate 2 is supported by the lower conveyer rollers 6 all over the entire width of the substrate 2 in the conveyer mechanism 5 shown in FIG. 2, the back side of the substrate 2 may be partly supported in its width direction. FIG. 4 shows a modification of the conveyer mechanism 5 on the basis of such a concept.

In a conveyer mechanism shown in FIG. 4, lower conveyer rollers 6 each have a shaft 6a extending perpendicular to the conveying direction D1 of the substrate 2, small-diameter portions 6b arranged one on either side of the shaft 6a, and a small-diameter portion 6d arranged at the center of the shaft 6a. The small-diameter portions 6b support both the sides 2c and 2c of the substrate 2 from the underside while and the small-diameter portion 6d supports the center of the substrate 2 in its width direction from the underside.

On the other hand, upper conveyer rollers 7 are each formed of a pair of roller members (7 and 7) sized to be brought into contact with the marginal region 2b of the substrate 2. The substrate is pressed against the lower conveyer rollers 6 by the pairs of roller members (7 and 7), so that the substrate is sandwiched between the lower conveyer rollers 6 and the upper conveyer rollers 7 while being conveyed.

Each of the lower conveyer rollers 6 shown in FIG. 4 further has large-diameter portions 6c arranged on the outer sides of the small-diameter portions 6b, and conical portions 6e each arranged between the small-diameter portion 6b and the large-diameter portion 6c. In other words, each of the lower conveyer rollers 6 is provided with the pair of conical portions 6e and 6e coaxially arranged such that their diameters decrease toward each other. The side surfaces of the pair of conical portions 6e and 6e function as guide surfaces to be brought into contact with lower edges of both the sides 2c and 2c of the substrate 2. In other words, the side surfaces of the pair of conical portions 6e and 6e constitute a positioning mechanism for positioning the substrate 2 relative to the supply nozzle 3 in a direction perpendicular to the conveying direction D1.

The modified conveyer mechanism 5 shown in FIG. 4 provides such an advantage that its contact surface with the substrate 2 is decreased. Further, since the large-diameter portions 6c are located outside the upper conveyer rollers 7, the lower conveyer rollers 6 and the upper conveyer rollers 7 can be aligned with each other in vertical directions.

Another embodiment will be explained next in relation to a positioning mechanism for positioning the substrate 2 relative to the supply nozzle 3.

Figure 8:
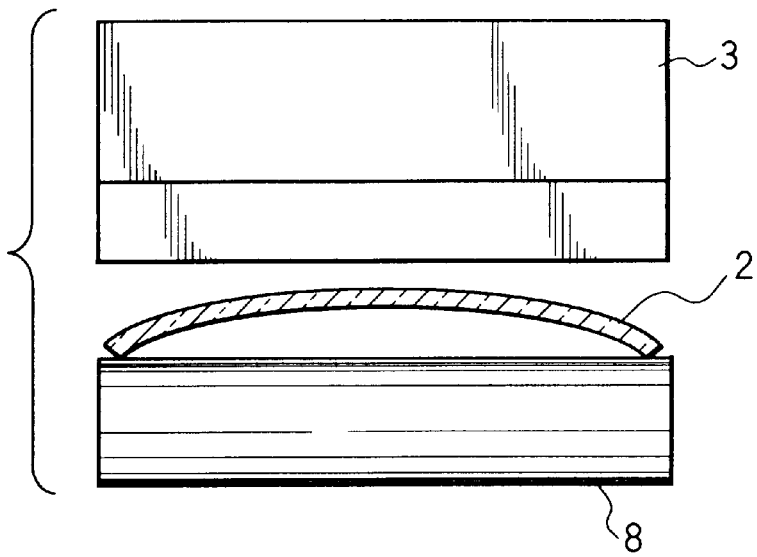
FIG. 8 is a partially cross-sectional front view schematically showing a relationship between a warped substrate and a supply nozzle for a developing liquid in a case where the main support roller has no suction holes.

Even though both the sides 2c of the substrate 2 are held horizontal, the central portion of the substrate 2 may rises up from the surface of the main support roller 8, as shown in FIG. 8, on the basis of a warp caused in the substrate. Where the height or horizontality of the supply nozzle 3 relative to the substrate 2 differs among positions in the width direction of the substrate 2 or nozzle 3, it becomes difficult to form a uniform film thickness in the width direction. For this reason, this embodiment employs a main support roller 8 formed of a suction roller which has a plurality of suction holes 11 on its circumferential surface, so that the substrate 2 is attracted and held through the suction holes 11 by means of a negative pressure from the inside. With the suction holes 11, the substrate 2 is positioned relative to the main support roller 8 and thus to the supply nozzle 3, because the supply nozzle 3 is arranged at a predetermined position relative to the main support roller 8.

Figure 5:
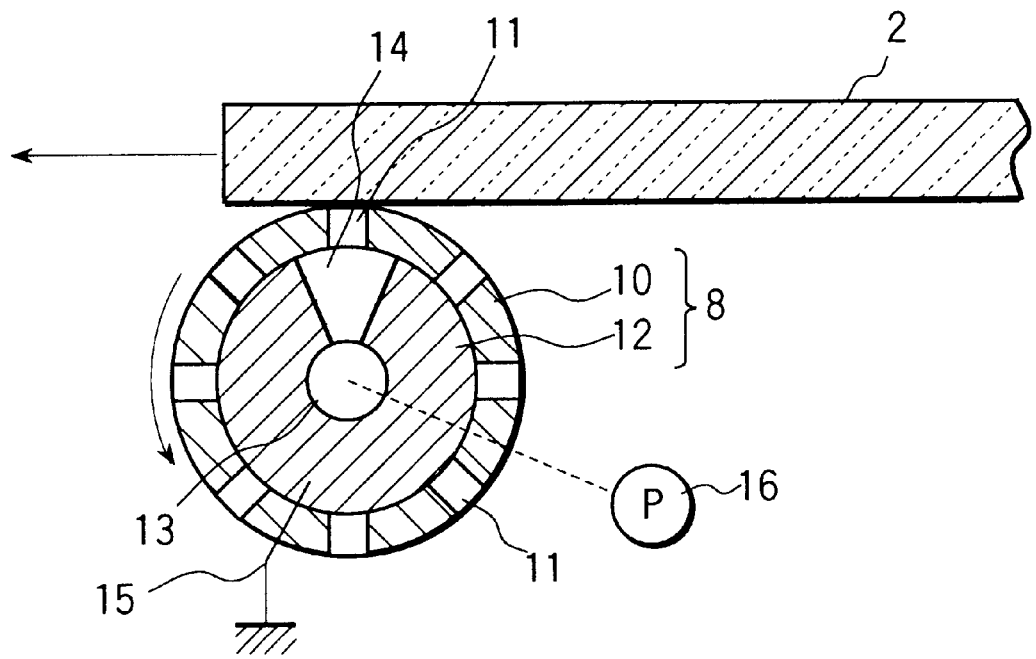
FIG. 5 is a cross-sectional side view showing a main support roller employed in the coating apparatus shown in FIG. 1.
Figure 6:
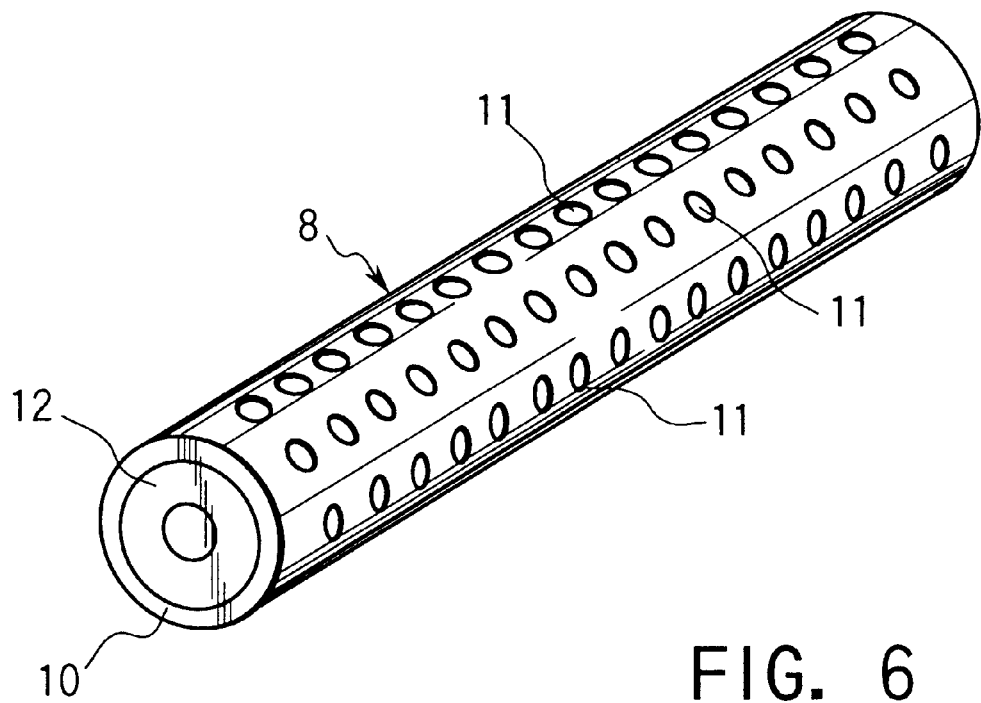
FIG. 6 is a perspective view showing the main support roller employed in the coating apparatus shown in FIG. 1.

The main support roller 8 shown in FIGS. 5 and 6 has an outer cylinder 10, which is rotatable and has a plurality of the suction holes 11 all around it, and a fixed inner cylinder 12, which is arranged inside the outer cylinder 10. The outer and inner cylinders 10 and 12 are made of metal, and the inner cylinder 12 is grounded through a grounding line 15. An axial bore 13 is formed in the inner cylinder 12 along its central axis and is connected to exhausting means 16, such as a vacuum pump. In the circumferential surface of the inner cylinder 12, a portion facing the substrate 2 and the supply nozzle 3, i.e., the upper portion, is opened by a cut-out groove 14 communicating with the axial bore 13 and having a sector cross section, while the other portion is in slidable contact with the inner surface of the outer cylinder 10 so as to seal the suction holes 11.

When a developing liquid is applied to the substrate 2, the axial bore 13 is exhausted by the exhausting means 16, while the outer cylinder 10 is rotated around the inner cylinder 12 in a direction indicated with an arrow in FIG. 5. During this time, the outer cylinder 10 is slid around the fixed inner cylinder 12, the suction holes 11 are closed by the outer surface of the inner cylinder 12 except when the suction holes 11 are aligned with the cut-out groove 14 forming a part of a suction passageway. As a result, since those of the suction holes 11 which come to the upper side form the suction passageway connecting the outside of the roller 8 to the axial bore 13, it is possible for the exhausting means 16 to perform a suction operation with a high efficiency.

With the main support roller 8 shown in FIGS. 5 and 6, while the substrate 2 is being conveyed, the bottom surface of the substrate 2 is attracted and held by the suction holes 11 toward the surface of the main support roller 8, i.e., the surface of the outer cylinder 10. As a result, the substrate 2 is conveyed while its flatness or horizontality in the width direction is corrected, so that a uniform thickness film of the process liquid is formed on the target region 2a. Further, since the surface of the outer cylinder 10 is grounded, and electric charges on the substrate 2 due to electrostatics are discharged through the grounding line 15, it is possible to prevent dust or the like from adhering to the substrate 2. Furthermore, in this case, no ionizer is necessary for removing electric charges from the surface of the substrate 2.

In the structure shown in FIG. 5, the inner cylinder 12 is fixed, while the outer cylinder 10 is rotatable. This relationship may be reversed, as in FIG. 10, which is a cross-sectional side view showing still another modification of the main support roller 8.

Figure 10:
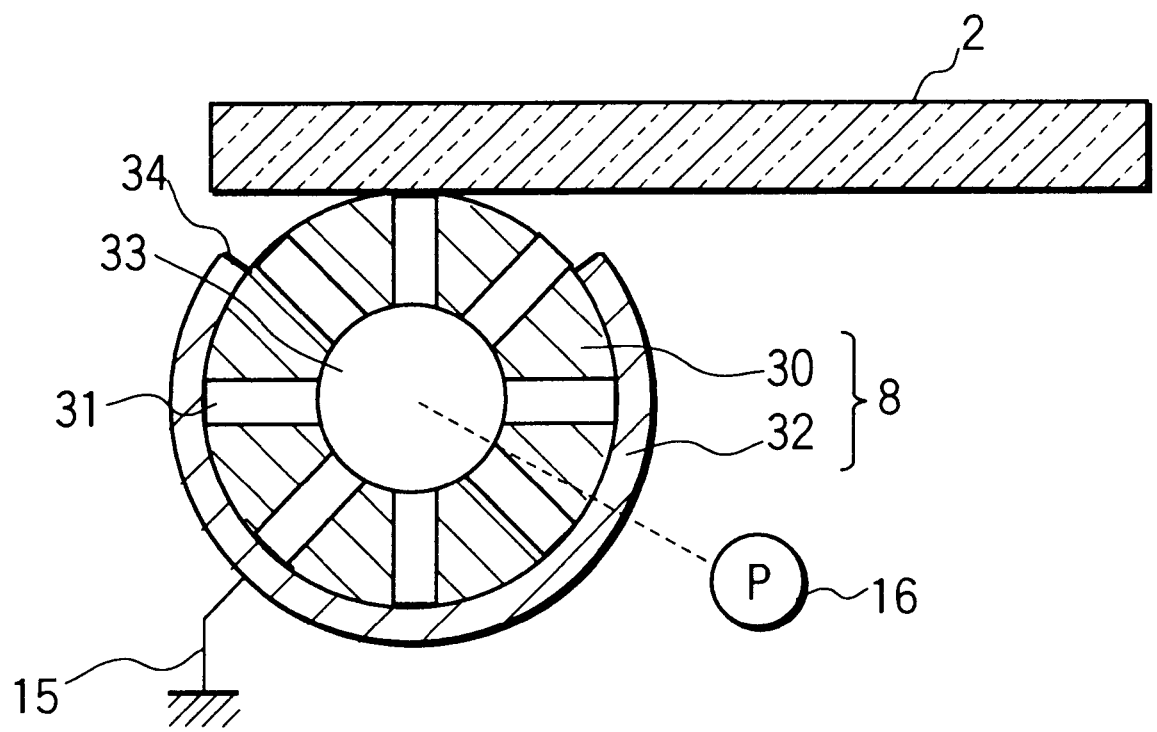
FIG. 10 is a cross-sectional side view showing still another modification of the main support roller.

The main roller 8 shown in FIG. 10 has an inner cylinder 30, which is rotatable and has a plurality of the suction holes 31 all around it, and an outer cylinder 32, which surrounds the inner cylinder 30 and is fixed. The inner and outer cylinders 30 and 32 are made of metal, and the outer cylinder 32 is grounded through a grounding line 15. An axial bore 33 is formed in the inner cylinder 30 along its central axis and is connected to exhausting means 16, such as a vacuum pump. In the circumferential surface of the outer cylinder 32, the upper portion is opened by a cut-out groove 34 communicating with the axial bore 33 and having a sector cross section, while the other portion is in slidable contact with the outer surface of the inner cylinder 30 so as to seal the suction holes 31.

When a developing liquid is applied to the substrate 2, the axial bore 33 is exhausted by the exhausting means 16, while the inner cylinder 30 is rotated within the outer cylinder 32. During this time, the inner cylinder 30 is slid along the fixed outer cylinder 32, the suction holes 31 are closed by the inner surface of the outer cylinder 32 except when the suction holes 31 are aligned with the cut-out groove 34 forming a part of a suction passageway.

As a result, with the modified main support roller 8 shown in FIG. 10, it is also possible to perform a suction operation by the exhausting means 16 with a high efficiency, as well as discharging the electric charges on the substrate 2.

Figure 7:
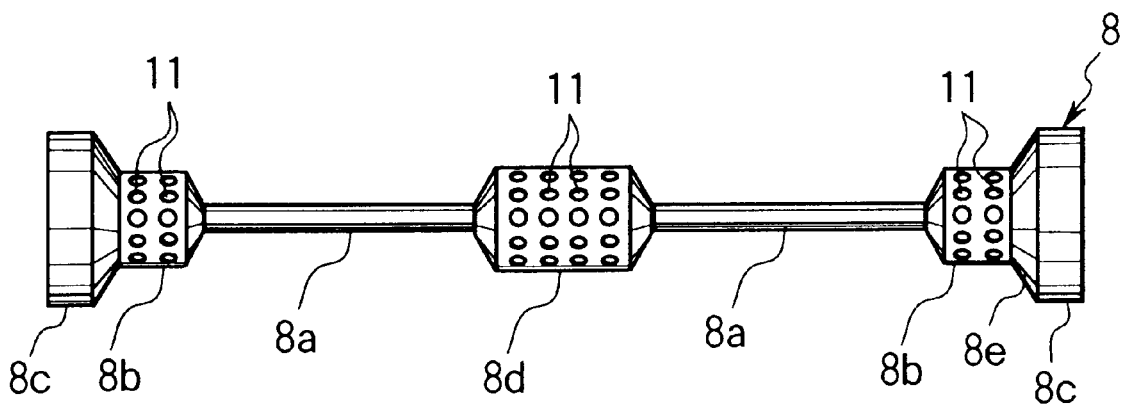
FIG. 7 is a front view showing a modification of the main support roller.

Although the main support roller 8 shown in the perspective view of FIG. 6 has a uniform diameter all over the width, the main support roller 8 may be modified to have a structure similar to the lower conveyer rollers 6 shown in FIG. 4. FIG. 7 is a front view showing another modification of the main support roller 8 made in light of such an aspect.

The main support roller 8 shown in FIG. 4 has a shaft 8a extending perpendicular to the conveying direction D1 of the substrate 2, small-diameter portions 8b arranged one on either side of the shaft 8a, and a small-diameter portion 8d arranged at the center of the shaft 8a. The small-diameter portions 8b support both the sides 2c and 2c of the substrate 2 from the underside while and the small-diameter portion 8d supports the center of the substrate 2 in its width direction from the underside. The small-diameter portions 8b and 8d are provided with a plurality of suction holes 11 arranged as shown in FIG. 5, so that the substrate 2 can be attracted and held thereon by a vacuum pressure from the inside of the roller 8.

The main support roller 8 shown in FIG. 7 further has large-diameter portions 8c arranged on the outer sides of the small-diameter portions 8b, and conical portions 8e each arranged between the small-diameter portion 8b and the large-diameter portion 8c. In other words, the main roller 8 is provided with the pair of conical portions 8e and 8e coaxially arranged such that their diameters decrease toward each other. The side surfaces of the pair of conical portions 8e and 8e function as guide surfaces to be brought into contact with lower edges of both the sides 2c and 2c of the substrate 2. In other words, the side surfaces of the pair of conical portions 8e and 8e constitute a positioning mechanism for positioning the substrate 2 relative to the supply nozzle 3 in a direction perpendicular to the conveying direction D1.

Figure 9:
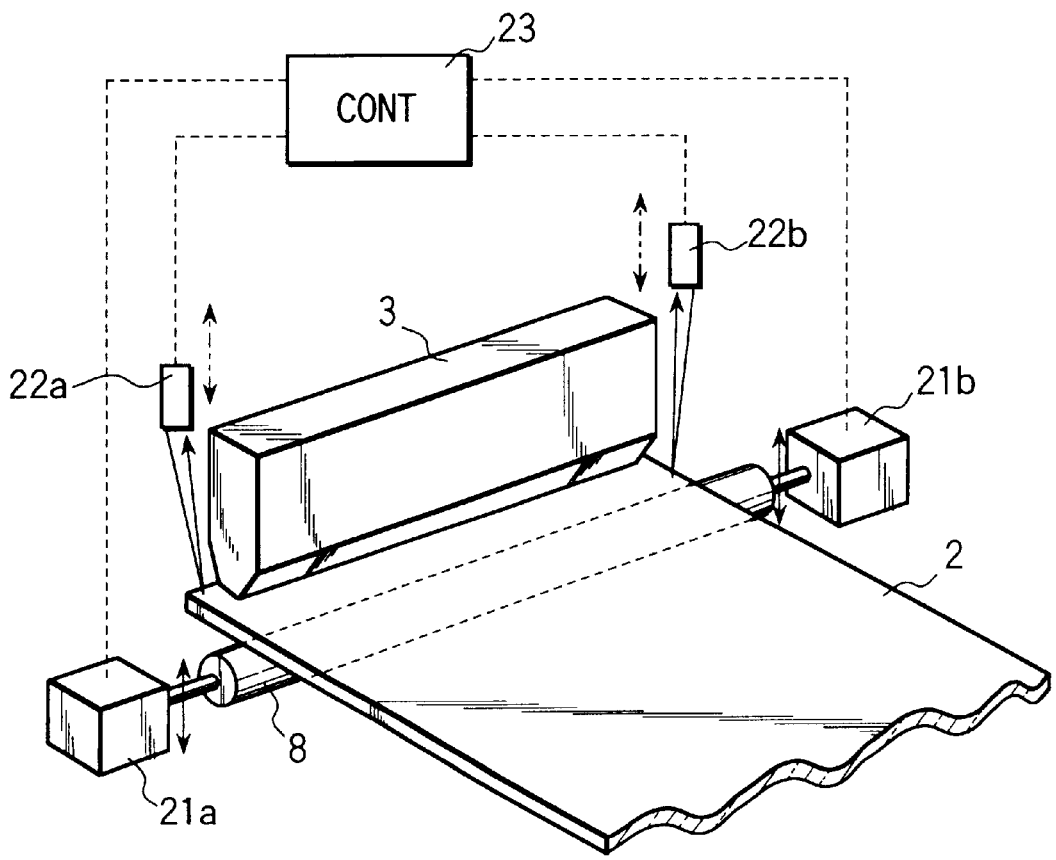
FIG. 9 is a perspective view showing a relationship between another modification of the main support roller provided with an elevating mechanism and sensors for measuring heights of the top surface of a substrate along both sides.

Although the main support roller 8 shown in FIG. 1 has a fixed axis, the axis may be arranged to be movable. FIG. 9 is a perspective view showing still another modification of the main support roller 8 made in light of such an aspect.

The main support roller 8 shown In FIG. 9 is provided, on both the sides, with a pair of elevating members 21b and 21b, which are independently and vertically movable. A pair of photoelectric sensors 22a and 22b are arranged close to the main support roller 8 on the upstream side, for measuring vertical positions or heights of the top surface of the substrate 2 on both its sides. The location of the sensors 22a and 22b is decided in light of the conveying speed of the substrate 2. Detected signals from the sensors 22a and 22b are sent to a controller 23 and are utilized to control the elevating members 21a and 21a.

For example, when a surface height of one side of the substrate 2 detected by the sensor 22a is lower than a surface height of the other side detected by the sensor 22b in the modified main support roller 8 shown in FIG. 9, one or both of the elevating members 21a and 21a are operated by the controller 23, so that the heights of both the sides of the substrate 2 become the same relative to the supply nozzle 3. Further, when distances between the substrate 2 and the supply nozzle 3 detected by the sensors 22a and 22b has greatly changed, one or both of the elevating members 21a and 21a are operated by the controller 23, so that the distance between the substrate 2 and the supply nozzle 3 is kept constant.

Note that, in place of the structure shown in FIG. 9, such a structure can be adopted that the axis of the main support roller 8 is fixed, and both the ends of the supply nozzle 3 are independently moved on the basis of detected signals from the sensors 22a and 22b.

Figure 11:
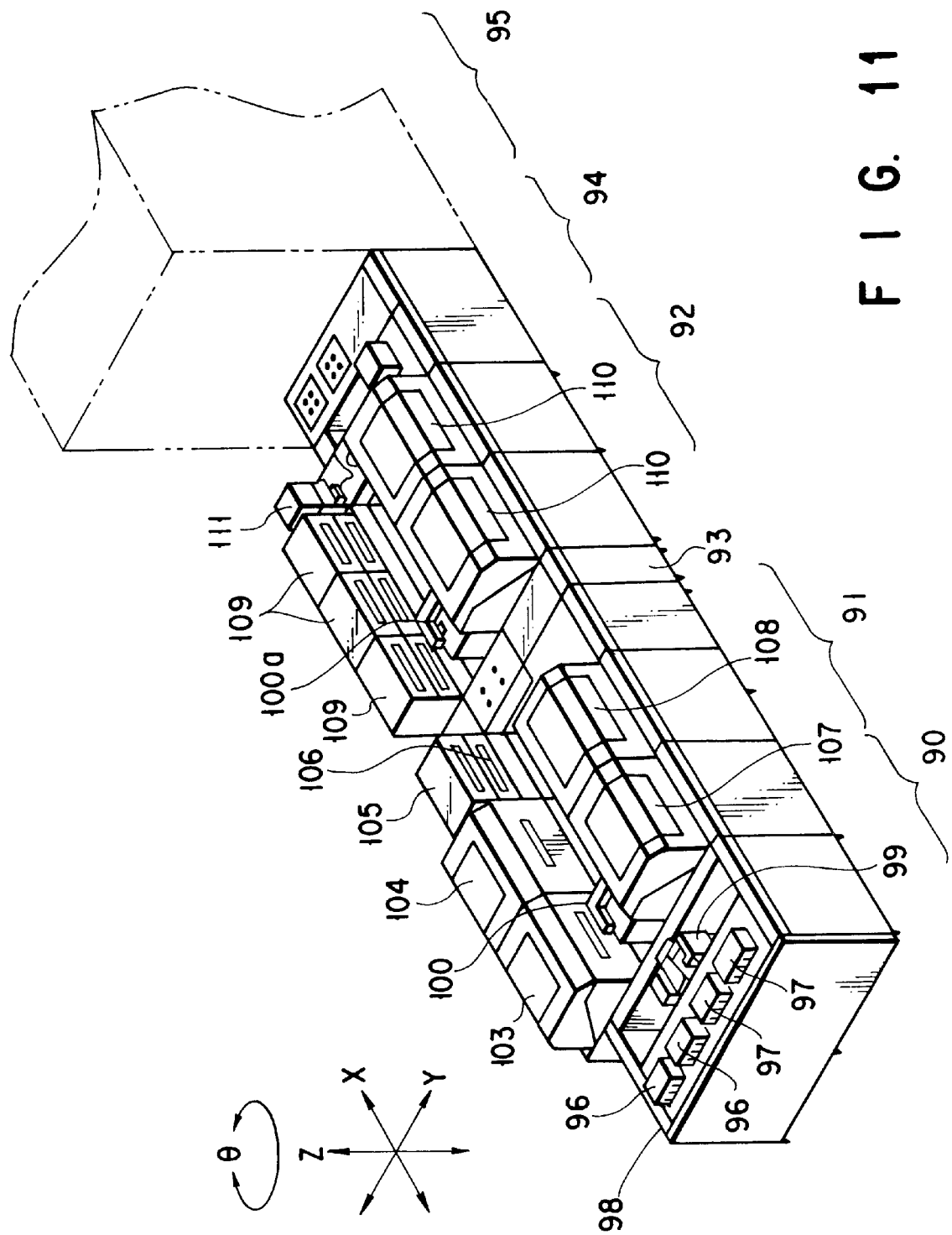
FIG. 11 is a perspective view showing a coating and developing system having the coating apparatus shown in FIG. 1.

A coating apparatus according to the present invention may be used as an independent coating apparatus for coating a semiconductor wafer or an LCD substrate with a developing or photo-resist liquid, or may be used as a unit incorporated in a coating and developing system as shown in FIG. 11.

The coating and developing system shown in FIG. 11 is constituted mainly by a loading section 90 for transferring LCD substrates into and out of the system, a first processing section 91, and a second processing section 92 connected to the first processing section 91 through an interface section 93. The second processing section 92 can be connected, through an interface section 94, to a light-exposing apparatus 95 for irradiating a photo-resist film with light so as to copy a minute predetermined pattern thereon.

In the coating and developing system having the above described structure, an unprocessed LCD substrate contained in a cassette 96 on a cassette table 98 is taken up by a transfer fork 99 in the loading section 90. The substrate is received by a main arm 80 of the first processing section 91 and is transferred into a brush scrubbing apparatus 103. After being subjected to a brush scrubbing and washing treatment in the brush scrubbing apparatus, the substrate is cleaned by means of jet water of a high-pressure in a jet-water washing apparatus 104.

After being cleaned, the substrate is subjected to a hydrophobia treatment in an adhesion apparatus 105, and is then cooled in a cooling apparatus 106. Then, the substrate is coated with a solvent from one end to the other in a coating apparatus 107 having a main structure similar to that of the coating apparatus shown in FIG. 1. Further, the substrate is coated with a photo-resist liquid so that a photo-resist film is formed.

An unnecessary part of the photo-resist film on the marginal region of the substrate is removed by a coating film removing apparatus 108. As a result, when being delivered therefrom, the substrate has no photo-resist film on its edge, so that no photo-resist film adheres to the main arm 80. Then the photo-resist film left on the substrate is subjected to a baking treatment by means of heating in a heating apparatus 109, and is exposed to light with a predetermined pattern in the light-exposing apparatus 95.

After being light-exposed, the substrate is transferred by a main arm 80a of the second processing section 92 to a developing apparatus 110 having a main structure similar to that of the coating apparatus shown in FIG. 1. In this apparatus, the light-exposed photo-resist film is developed by a developing liquid. Then, the developing liquid is washed out by a rinsing liquid, so that a developing treatment is completed. After the developing treatment, the substrate is transferred into a cassette 97 in the loading section 90, and then is transferred therefrom to the next process.

In the above described embodiment, the present invention is applied to a coating apparatus for coating a semiconductor wafer or an LCD substrate with a process liquid, such as a developing liquid or a photo-resist liquid. The present invention, however, may be applied to a coating apparatus of other types, e.g., for coating another target substrate, such as a CD, with a process liquid, or for coating an electric board with a green film. Further, another process liquid, such as a polyimide-based process liquid (PIQ) or a process liquid containing a glass component (SOG) may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A coating apparatus for coating a target region of an LCD semiconductor substrate with a process liquid selected from the group consisting of a photo-resist liquid and a developing liquid for a photo-resist, wherein the target region has a width substantially covering the width of the LCD substrate, comprising:

a plurality of lower conveyer rollers configured to support said substrate substantially horizontal and linearly conveying said substrate in a conveying direction while being in contact with a bottom surface of said substrate;

a main support roller configured to support said substrate in cooperation with said lower conveyer rollers while being in contact with said bottom surface of said substrate, said main support roller having a rotational axis extending perpendicular to said conveying direction;

a supply nozzle arranged above said main support roller configured to supply said process liquid onto said target region when said substrate is being conveyed by said lower conveyer rollers and is passing over said main support roller, said supply nozzle having a supply port which is laterally long and narrow for supplying said process liquid as a band all at once substantially all over a width of said target region perpendicular to said conveying direction; and a positioning mechanism configured to position said substrate relative to said supply nozzle in a direction perpendicular to said conveying direction when said substrate is passing over said main support roller and is being supplied with said process liquid from said supply nozzle.

2. The apparatus according to claim 1, further comprising an upper conveyer roller having a rotational axis parallel to axes of said lower conveyer rollers, wherein said substrate is conveyed while being sandwiched between said lower conveyer rollers and said upper conveyer roller.

3. The apparatus according to claim 2, wherein said upper roller is arranged so as not to be brought into contact with said target region of said substrate but only with part of said substrate.

4. The apparatus according to claim 2, wherein said positioning mechanism comprises a pair of upper guide surfaces arranged on said upper conveyer roller so as to be brought into contact with opposite edges of said substrate, which define said width of said substrate in a direction perpendicular to said conveying direction.

5. The apparatus according to claim 4, wherein said pair of upper guide surfaces are defined by side surfaces of a pair of conical portions arranged on said upper conveyer roller so as to decrease their diameters toward each other.

6. The apparatus according to claim 2, wherein said positioning mechanism comprises a pair of lower guide surfaces arranged on one of said lower conveyer rollers and said main support roller so as to be brought into contact with opposite edges of said substrate, which define said width of said substrate in a direction perpendicular to said conveying direction.

7. The apparatus according to claim 6, wherein said pair of lower guide surfaces are defined by side surfaces of a pair of conical portions arranged on one of said lower conveyer rollers and said main support roller so as to decrease their diameters toward each other.

8. The apparatus according to claim 1, wherein said positioning mechanism has a plurality of suction holes arranged on a circumferential surface of said main support roller so as to attract and hold said substrate by means of vacuum through said suction holes.

9. The apparatus according to claim 8, wherein said main support roller comprises a fixed inner cylinder having a cut-out groove opened opposite said supply nozzle, for forming a part of a suction passageway, and an outer cylinder having said suction holes and rotatable around said inner cylinder, such that said suction holes are closed by said inner cylinder except when said suction holes are aligned with said cut-out groove.

10. The apparatus according to claim 9, wherein said inner cylinder has an axial bore connected to an exhausting source and communicating with said cut-out groove.

11. The apparatus according to claim 8, wherein said main support roller comprises a fixed outer cylinder having a cut-out groove opened opposite said supply nozzle, for forming a part of a suction passageway, and an inner cylinder having said suction holes and rotatable in said inner cylinder, such that said suction holes are closed by said outer cylinder except when said suction holes are aligned with said cut-out groove.

12. The apparatus according to claim 11, wherein said inner cylinder has an axial bore connected to an exhausting source and communicating with said suction holes.

13. The apparatus according to claim 1, wherein said main support roller has a conductive circumferential surface which is grounded.

14. The apparatus according to claim 1, comprising a detecting mechanism for detecting a position of a top surface of said substrate in a vertical direction, and a controlling mechanism for causing a distance between said supply nozzle and said substrate to be constant, by adjusting a distance between said supply nozzle and said main support roller on the basis of a signal from said detecting mechanism.

15. The apparatus according to claim 14, wherein said detecting mechanism detects positions, in a vertical direction, of opposite edges of said substrate, which define a width of said substrate in a direction perpendicular to said conveying direction, and said controlling mechanism is capable of adjusting distances between said supply nozzle and said opposite edges of said substrate, independently of each other.

16. A coating apparatus for coating a target region of an LCD semiconductor substrate with a process liquid selected from the group consisting of a photo-resist liquid and a developing liquid for a photo-resist, wherein the target region has a width substantially covering the width of the LCD substrate, comprising:

a plurality of lower conveyer rollers configured to support said substrate substantially horizontal and to linearly convey said substrate in a conveying direction while being in contact with a bottom surface of said substrate;

an upper conveyer roller having a rotational axis parallel to those of said lower conveyer rollers, wherein said substrate is conveyed while being sandwiched between said lower conveyer rollers and said upper conveyer roller, and wherein said upper roller is arranged so as not to be brought into contact with said target region of said substrate but only with part of said substrate;

a main support roller configured to support said substrate in cooperation with said lower conveyer rollers while being in contact with said bottom surface of said substrate, said main support roller having a rotational axis extending perpendicular to said conveying direction;

a supply nozzle arranged above said main support roller and configured to supply said process liquid onto said target region when said substrate is being conveyed by said lower conveyer rollers and is passing over said main support roller, said supply nozzle having a supply port which is laterally long and narrow for supplying said process liquid as a band all at once substantially all over a width of said target region perpendicular to said conveying direction; and a positioning mechanism configured to position said substrate relative to said supply nozzle in a direction perpendicular to said conveying direction when said substrate is passing over said main support roller and is being supplied with said process liquid from said supply nozzle, wherein said positioning mechanism comprises a pair of upper guide surfaces arranged on said upper conveyer roller so as to be brought into contact with opposite edges of said substrate, which define a width of said substrate in a direction perpendicular to said conveying direction, and wherein said pair of upper guide surfaces are defined by side surfaces of a pair of conical portions arranged on said upper conveyer roller so as to decrease their diameters toward each other.

17. The apparatus according to claim 16, wherein said positioning mechanism has a plurality of suction holes arranged on a circumferential surface of said main support roller so as to attract and hold said substrate by means of vacuum through said suction holes.

18. The apparatus according to claim 16, further comprising a detecting mechanism configured to detect a position of a top surface of said substrate in a vertical direction, and a controlling mechanism configured to cause a distance between said supply nozzle and said substrate to be constant, by adjusting a distance between said supply nozzle and said main support roller on the basis of a signal from said detecting mechanism.

19. The apparatus according to claim 16, wherein said substrate consists of an LCD substrate having a rectangular shape, said target region has a rectangular shape, and said process liquid is selected from the group consisting of a photo-resist liquid and a developing liquid for a photo-resist.

20. A coating apparatus for coating a target region of an LCD semiconductor substrate with a process liquid selected from the group consisting of a photo-resist liquid and a developing liquid for a photo-resist, wherein the target region has a width substantially covering the width of the LCD substrate, comprising:

a plurality of lower conveyer rollers configured to support said substrate substantially horizontal and linearly conveying said substrate in a conveying direction while being in contact with a bottom surface of said substrate;

an upper conveyer roller having a rotational axis parallel to those of said lower conveyer rollers, wherein said substrate is conveyed while being sandwiched between said lower conveyer rollers and said upper conveyer roller, and wherein said upper roller is arranged so as not to be brought into contact with said target region of said substrate but only with part of said substrate;

a main support roller configured to support said substrate in cooperation with said lower conveyer rollers while being in contact with said bottom surface of said substrate, said main support roller having a rotational axis extending perpendicular to said conveying direction;

a supply nozzle arranged above said main support roller configured to supply said process liquid onto said target region when said substrate is being conveyed by said lower conveyer rollers and is passing over said main support roller, said supply nozzle having a supply port which is laterally long and narrow for supplying said process liquid as a band all at once substantially all over a width of said target region perpendicular to said conveying direction; and a positioning mechanism configured to position said substrate relative to said supply nozzle in a direction perpendicular to said conveying direction when said substrate is passing over said main support roller and is being supplied with said process liquid from said supply nozzle, wherein said positioning mechanism comprises a pair of lower guide surfaces arranged on one of said lower conveyer rollers and said main support roller so as to be brought into contact with opposite edges of said substrate, which define a width of said substrate in a direction perpendicular to said conveying direction, and wherein said pair of lower guide surfaces are defined by side surfaces of a pair of conical portions arranged on one of said lower conveyer rollers and said main support roller so as to decrease their diameters toward each other.

21. The apparatus according to claim 20, wherein said positioning mechanism has a plurality of suction holes arranged on a circumferential surface of said main support roller so as to attract and hold said substrate by means of vacuum through said suction holes.

22. The apparatus according to claim 20, further comprising a detecting mechanism configured to detect a position of a top surface of said substrate in a vertical direction, and a controlling mechanism configured to cause a distance between said supply nozzle and said substrate to be constant, by adjusting a distance between said supply nozzle and said main support roller on the basis of a signal from said detecting mechanism.

23. The apparatus according to claim 20, wherein said substrate consists of an LCD substrate having a rectangular shape, said target region has a rectangular shape, and said process liquid is selected from the group consisting of a photo-resist liquid and a developing liquid for a photo-resist.

* * * * *